(12) United States Patent
Zhang

(10) Patent No.: US 7,298,301 B2
(45) Date of Patent: Nov. 20, 2007

(54) SYNCHRONOUS DATA SERIALIZATION CIRCUIT

(75) Inventor: Bo Zhang, Las Flores, CA (US)

(73) Assignee: Broadcom Corporation, Irvine, CA (US)

( * ) Notice: Subject to any disclaimer, the term of this patent is extended or adjusted under 35 U.S.C. 154(b) by 10 days.

(21) Appl. No.: 10/919,093

(22) Filed: Aug. 16, 2004

(65) Prior Publication Data

US 2005/0015638 A1    Jan. 20, 2005

Related U.S. Application Data

(63) Continuation of application No. 10/431,103, filed on May 6, 2003, now Pat. No. 6,867,716, which is a continuation of application No. 09/910,436, filed on Jul. 19, 2001, now Pat. No. 6,614,371.

(51) Int. Cl.
*H03M 9/00*    (2006.01)

(52) U.S. Cl. ....................... 341/101; 341/100

(58) Field of Classification Search ................ 341/100, 341/101

See application file for complete search history.

(56) References Cited

U.S. PATENT DOCUMENTS

| | | | |
|---|---|---|---|
| 5,319,369 A | | 6/1994 | Majos et al. |
| 5,654,969 A | * | 8/1997 | Wilhelmsson ............... 370/460 |
| 5,774,080 A | | 6/1998 | Morley |
| 6,362,680 B1 | | 3/2002 | Barnes |
| 6,400,291 B1 | * | 6/2002 | Sankey ....................... 341/100 |
| 6,614,371 B2 | | 9/2003 | Zhang |
| 6,909,309 B2 | * | 6/2005 | Green ......................... 326/115 |
| 6,911,855 B2 | * | 6/2005 | Yin et al. ................... 327/210 |
| 2002/0087991 A1 | * | 7/2002 | Ortega Rodriguez et al. . 725/64 |

OTHER PUBLICATIONS

Cong. H. et al. (2001). "A 10Gb/s 16:1 Multiplexer and 10 GHz Clock Synthesizer in 0.25 μm SiGe BiCMOS," IEEE International Solid-State Circuits Conference 2001/Session 5/Gigabit Optical Communications I/5 4, 80-81, 434-435, no month.

Fujii, M. (1998). "A 150 mW 8:1 MUX and a 170 mW 1:8 DEMUX for 2.4 Gb/s Optical-Fiber Communication Systems Using n-AlGaAs/i-InGaAs HJFET's," IEEE Transactions on very large scale integration (VLSI) Systems, vol. 6, No. 1, Mar. 1998, 43-46.

(Continued)

*Primary Examiner*—Howard L. Williams
*Assistant Examiner*—Joseph Lauture

(57) ABSTRACT

In accordance with the present invention a data processing circuit includes a first data path for processing first data. The first data path includes a first data storage circuit. A second data path is provided for processing second data. The second data path includes a second data storage circuit. A multiplexer having a first input coupled to the first data path and a second input coupled to the second data path receives the stored values. The multiplexer includes a select input coupled to a clock signal. A delay circuit is configured to delay storage of the second data in the second data storage circuit, wherein the first data storage circuit stores the first data in response to receiving a first timing signal, and the second data storage circuit stores the second data in response to receiving a second timing signal.

20 Claims, 8 Drawing Sheets

OTHER PUBLICATIONS

Fukaishi, M. et al., (1999). "A 2.125-Gb/s BiCMOS Fiber Channel Transmitter for Serial Data Communications," IEEE Journal of Solid-State Circuits, vol. 34, No. 9, Sep. 1999, 1325-1330.

Ishida, K. et al., (1991). "A 10-GHz 8-b Multiplexer/Demultiplexer Chip Set for the SONET STS-192 System,"IEEE Journal of Solid-State Circuits, 26(12):1936-1943, no month.

Mattia, J.P. (1999). "High-Speed Multiplexers: A 50Gb/s 4:1 MUX in InP HBT Technology," IEEE GaAs IC Symp., 1999, 189-192, no month.

Möller, M. et al., (1998). "SiGe retiming high-gain power MUX for directly driving an EAM up to 50 Gbit/s," Electronics Letters 34(18):1782-1784, no month.

Murata, K. et al. (1992) . "20Gbit/s GaAs MESFET Multiplexer IC Using a Novel T-Type Flip-Flop Circuit," Electronics Letter 28(22): 2090-2091, no month.

Nakura, T. et al., (2000). "A 3.6-Gb/s 340-m W 16:1 Pipe-Lined Multiplexer using 0.18 μm SOI-CMOS Technology," IEEE Journal of Solid-State Circuits, vol. 35, No. 5, May 2000, 751-756.

Navarro S. Jr., J. and Van Noije, W.A.M. (1998). "Design of a 8:1 MUX AT 1.7Gbit/s in 0.8 μm CMOS Technology,": in: Proceedings of the 8th Great Lakes Symposium on VLSI Louisiana, Feb. 1998, 103-107, no month.

Numata, K. et al. (1995). "Ultra-Low-Power-Consumption Hetrojunction FET 8:1 MUX/1:8 DEMUX for 2.4-GBPS Optical-Fiber Communication Systems," IEEE GaAs IC Symposium 39-42, no month.

Seshita, T. et al. (1994). 20GHz 8b Multiplexer Implemented with 0.5 μm WNx/W-Gate GaAs MESFET's, IEEE International Solid State Circuits Conference 1994/Session 10/Optical Communication/Paper TP 10.3, 172-173, no month.

Stout, C.L. and Doernberg, J. (1993). "10-Gb/s Silicon Bipolar 8:1 Multiplexer and 1:8 Demultiplexer," IEEE Journal of Solid-State Circuits 28(3):339-343, no month.

Yamaguchi, S. et al. (1992). "Ultrahigh Speed 2 bit MUX and DEMUX ICs Using AlGaAs/GaAs L-BCT Technology," Electronics Letters, 28(7):690-692, no month.

* cited by examiner

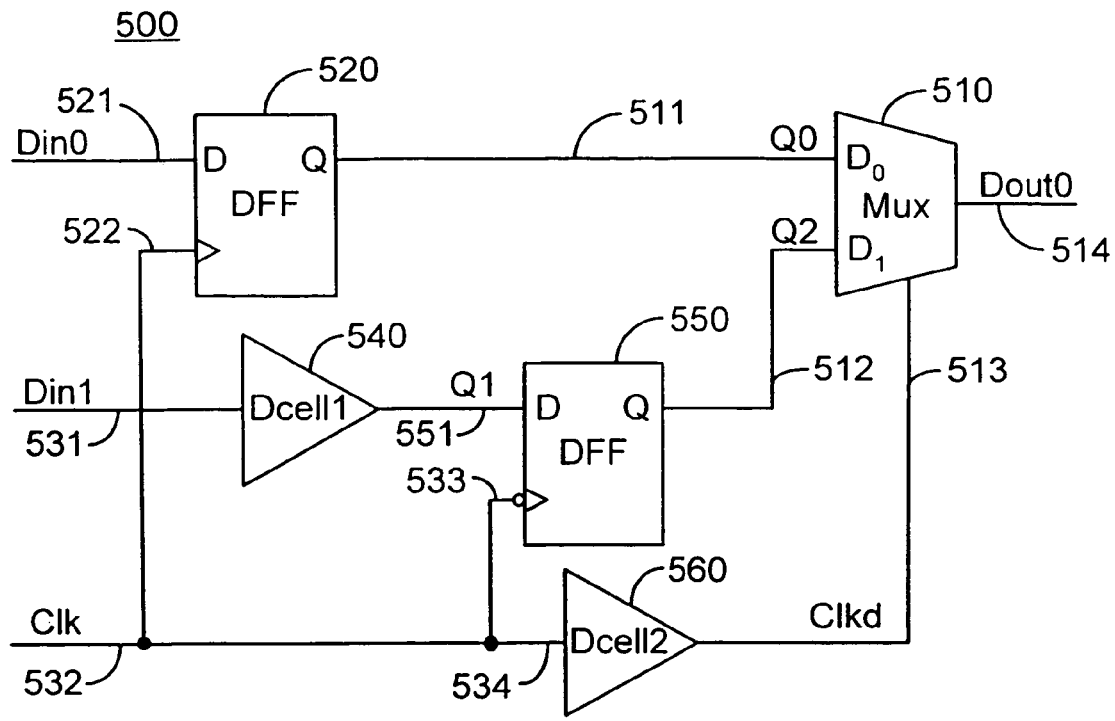
FIG. 5
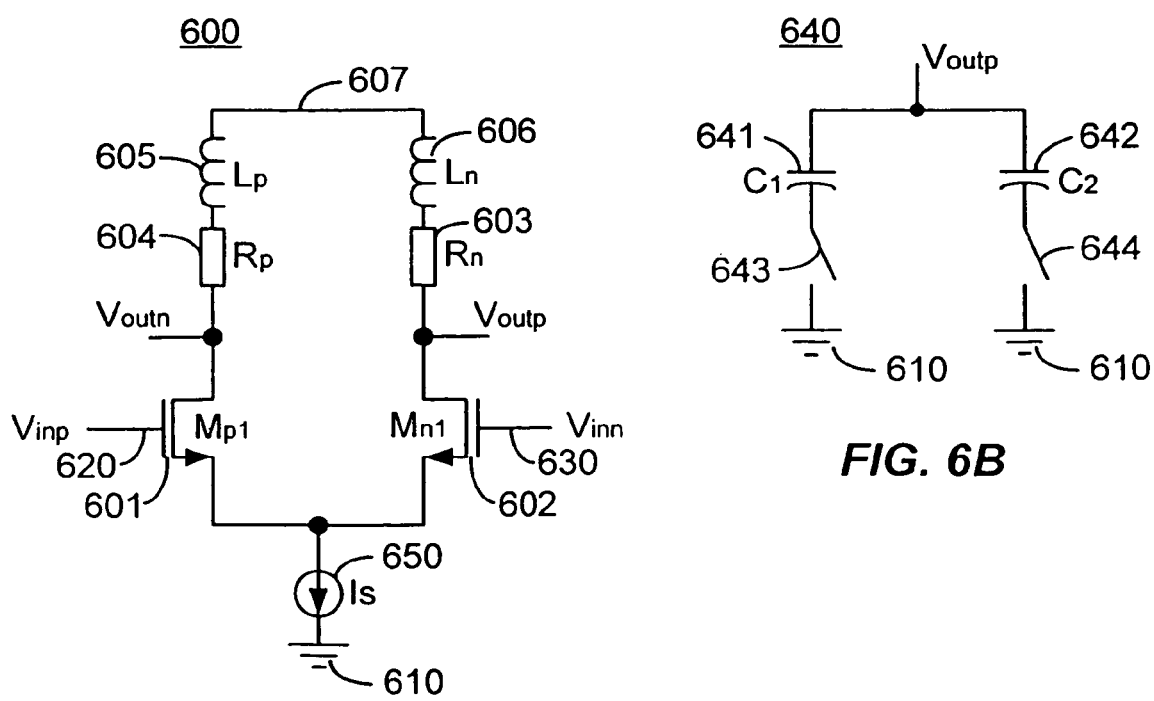
FIG. 6B
FIG. 6A

SYNCHRONOUS DATA SERIALIZATION CIRCUIT

CROSS-REFERENCE TO RELATED APPLICATIONS

This continuation application claims the benefit of non-provisional U.S. application Ser. No. 10/431,103, filed May 6, 2003, now U.S. Pat. No. 6,867,716, which is a continuation of U.S. Application Ser. No. 09/910,436, filed Jul. 19, 2001, now U.S. Pat. No. 6,614,371.

BACKGROUND

This invention relates to integrated circuits utilized for data processing applications. More particularly, the present invention relates to a data processing circuit and method for serializing data.

Integrated circuits are commonly utilized in digital and mixed signal systems for processing data. For example, integrated circuits typically form the basic building blocks for computer systems, digital data communications systems, and industrial data processing systems as well as other electronic systems. One particular example of a digital data communication system that may benefit from advanced data processing techniques is a telecommunication system such as a serial optical network ("SONET") system.

The rise of the information age has put ever increasing demands on integrated circuits used to process data. For example, systems previously designed to carry only sound, such as the telephone system, are now being designed to carry digital and mixed signal data between both individual users and large data processing networks such as computer networks. As more users store and communicate data using data networks, more and more data must be processed by the integrated circuits that are used to build the data processing systems. Accordingly, to keep up with the increasing data processing demands, integrated circuits must be designed to process data at ever increasing speeds.

Integrated circuits used for data processing applications commonly require that data from a variety of different data sources be combined and transmitted over a single data line. For example, many systems require that parallel digital data signals be combined and transmitted serially over a single data line to another part of the system. A common circuit used to perform such a task is a serializer or multiplexer.

FIG. 1 illustrates a functional diagram of a typical multiplexer commonly used and well known in the art. The multiplexer 100 includes input lines D0 and D1 for receiving data Din0 and Din1, a select line for receiving a select control signal, and an output line. The multiplexer couples only one of the input lines to the output line in accordance with the particular state of the select control signal. For a 2-input multiplexer, the select line may receive a binary logic signal for coupling each of the input lines to the output line.

However, as the speed of data processing systems increases, traditional multiplexer circuits used to serialize data may fail to work effectively. For example, one problem is that the multiplexer circuitry must be designed and timed such the data received on each of the input lines of the multiplexer is available at the output of the multiplexer when the particular input line is selected by the select line. If the timing of the data received on each of the multiplexer inputs and the control signals received on the select line are not precisely controlled, then the output may contain erroneous data, and the system will not work.

Therefore, what is needed is a data processing system and method that can serialize data at very high frequencies. Additionally, what is needed is a synchronous data serialization circuit that can process data from multiple data sources at very high frequencies.

SUMMARY

In accordance with the present invention a data processing circuit includes a first data path for processing first data, the first data path including a first data storage circuit, a second data path for processing second data, the second data path including a second data storage circuit, a multiplexer having a first input coupled to the first data path and a second input coupled to the second data path, the multiplexer having a select input coupled to a clock signal, and a delay circuit configured to delay storage of the second data in the second data storage circuit, wherein the first data storage circuit stores the first data in response to receiving a first timing signal, and the second data storage circuit stores the second data in response to receiving a second timing signal.

In one embodiment, the first data storage circuit is a flip-flop that receives and stores the first data in response to a clock signal making a transition in a first direction, such as the rising edge of a clock, for example. Additionally, in one embodiment, the second data storage circuit is a flip-flop that receives and stores the second data in response to a clock signal making a transition in a second direction opposite the first direction, such as the falling edge of a clock, for example. Furthermore, in one embodiment, the delay circuit is configured to receive the second data on a first input and transmit delayed second data to an input of the second data storage circuit.

The following detailed description and the accompanying drawings provide a better understanding of the nature and advantages of the present invention.

BRIEF DESCRIPTION OF THE DRAWINGS

FIG. 5 illustrates a data processing circuit including a multiplexer according to another embodiment of the present invention.

FIGS. 6A-B illustrate a delay cell according to one embodiment of the present invention.

DETAILED DESCRIPTION

Figure 1:
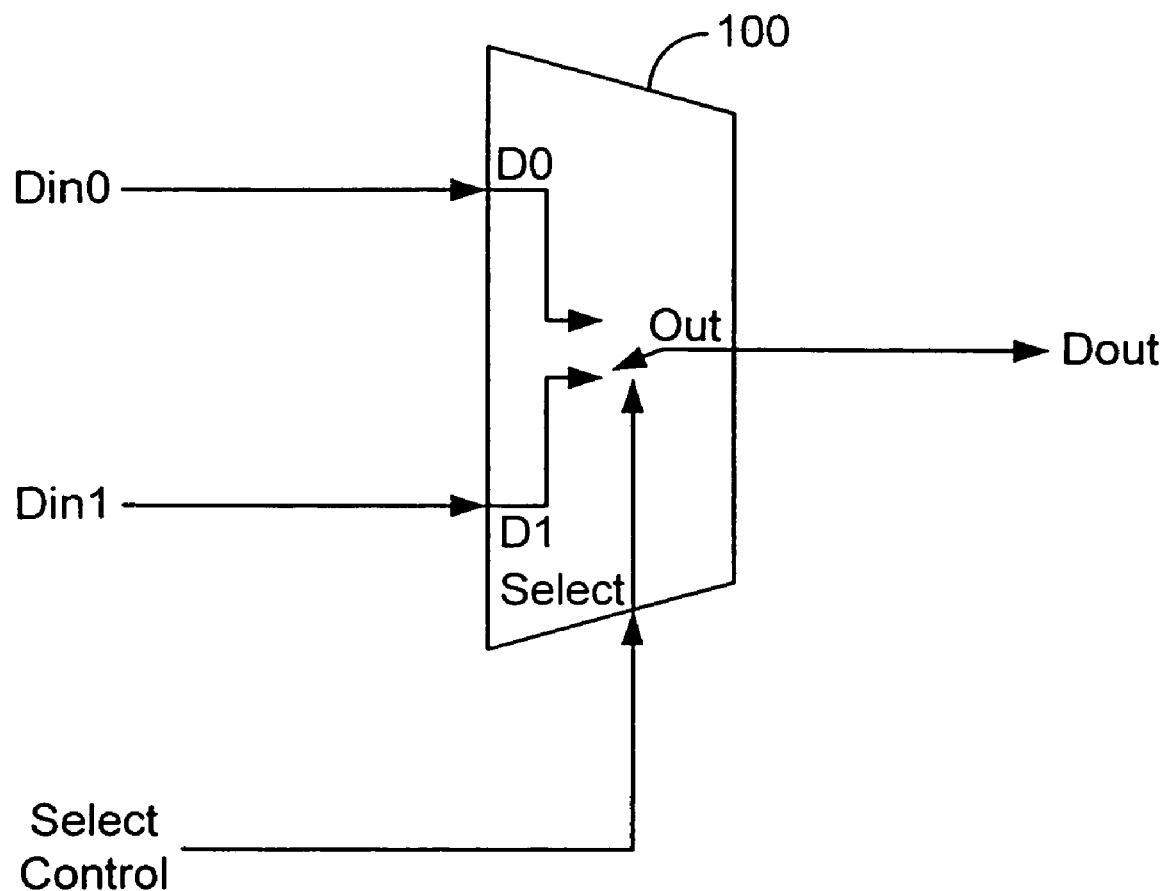
FIG. 1 illustrates a typical multiplexer known in the prior art.
Figure 2:
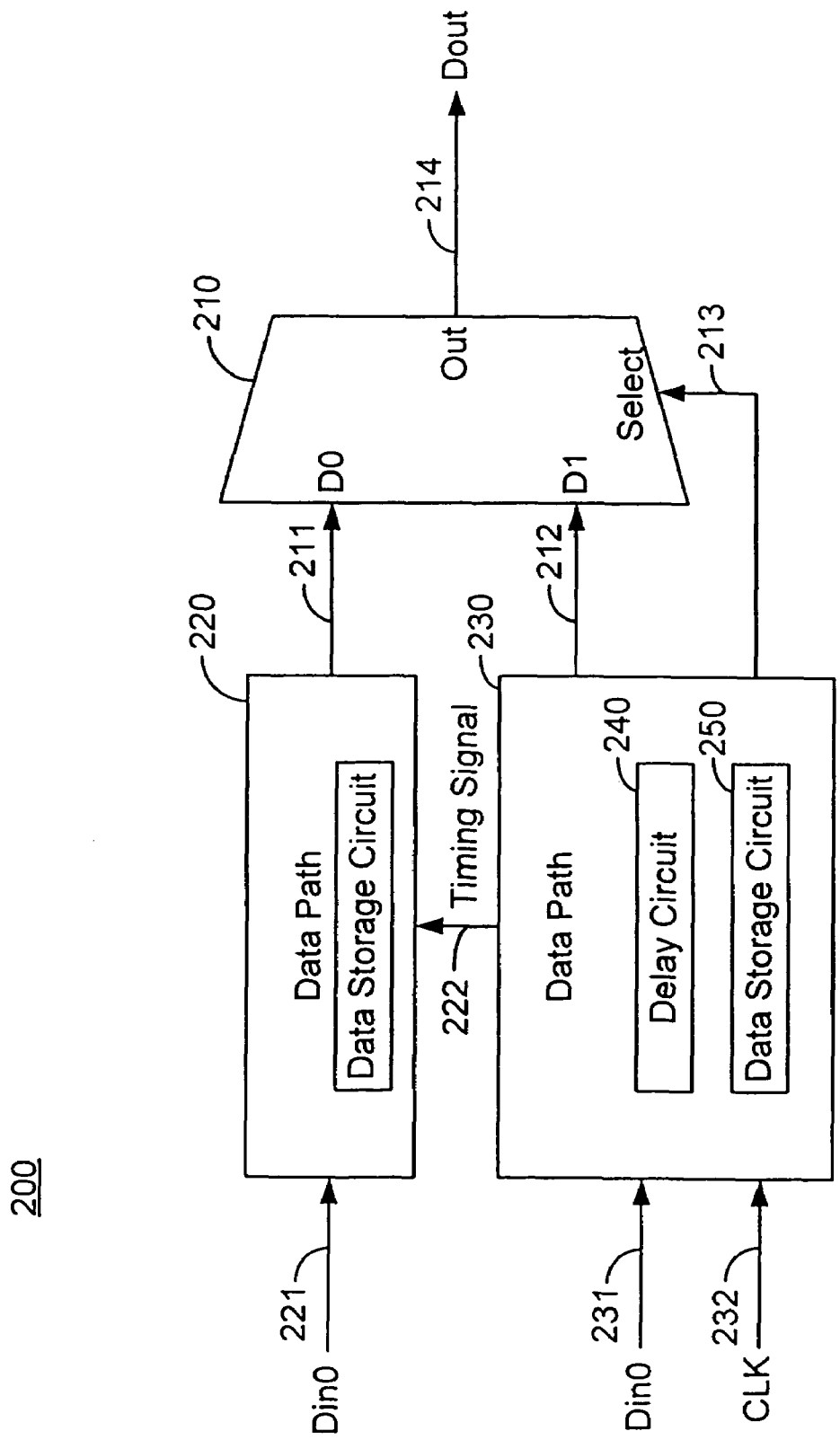
FIG. 2 illustrates a data processing circuit including a multiplexer according to one embodiment of the present invention.

A data processing circuit and method according to the present invention solves the problems associated with prior art data serialization circuits and methods and provides a particularly advantageous solution for high speed data processing systems. FIG. 2 illustrates a data processing circuit 200 including a multiplexer 210 according to one embodiment of the present invention. Data processing circuit 200 includes a multiplexer 210, a first data path 220, and a second data path 230. First data path 220 receives and processes data Din0 on data input line 221. The first data path 220 includes a data storage circuit 225 for storing the data Din0 received on the data input line 221. The data storage circuit 225 may be a clocked data storage circuit that stores the data on data input line 221 in response to receiving a timing signal on line 222. The output of first data path 220 is coupled to an input line 211 of multiplexer 210.

Second data path 230 receives data Din1 on data input line 231. The second data path 230 also receives a clock signal ("CLK") on clock signal line 232. The second data path 230 also includes a data storage circuit 250 for storing the data Din1 received on the data input line 231. The data storage circuit 250 may be a clocked data storage circuit that stores the data on data input line 231 in response to receiving a timing signal. The timing signals may be, for example, positive or negative transitions (e.g., rising or falling edges) of CLK on clock signal line 232. However, timing signals may also be derived from CLK. The output of second data path 230 is coupled to a second input line 212 of multiplexer 210. The second data path also generates a select signal on select input 213 for controlling the multiplexer 210.

The second data path 230 also includes a delay circuit 240. The delay circuit 240 is configured to delay the storage of the data Din1 on data input line 231 in the data storage circuit 250. In one exemplary embodiment, the delay circuit 240 delays the storage of input data Din1 by approximately one-half the period of CLK. This advantageously results in a phase relationship between the data on multiplexer input lines 211 and 212 of one-half the period of CLK. The data processing system 200 may also be referred to herein as a synchronous multiplexer circuit. It is to be understood that a synchronous multiplexer circuit may be either a stand alone system, or integrated as part of a larger integrated data processing system. It is further to be understood that the amount of delay may vary depending on the circuit application.

Figure 3:
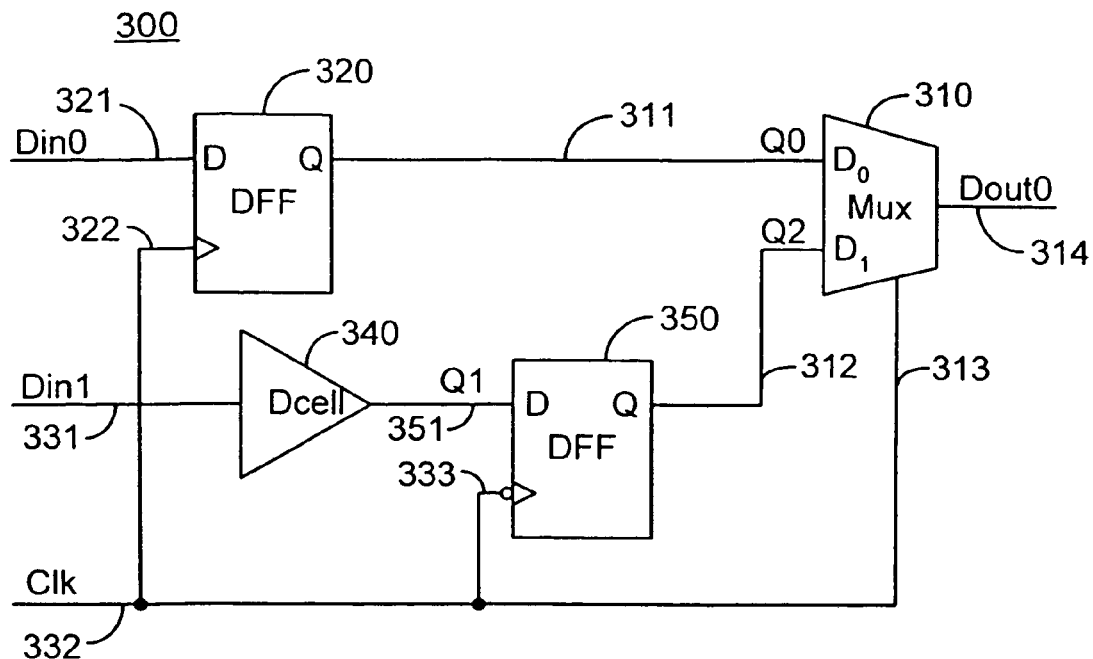
FIG. 3 illustrates a data processing circuit including a multiplexer according to another embodiment of the present invention.

FIG. 3 illustrates a data processing circuit 300 according to another exemplary embodiment of the present invention. The data processing circuit 300 includes a multiplexer 310, a D type flip-flop ("DFF") 320, a delay cell circuit 340, and a second DFF 350. The DFF 320 is coupled to receive a first data bit Din0 on data input line 321. A clock signal CLK is received on clock line 332. The clock line is divided, and clock signals are transmitted to DFF 320 on line 322, DFF 350 on line 333, and multiplexer 310 on line 313. DFF 320 is a rising edge triggered flip-flop. Accordingly, the DFF 320 stores data Din0 in response to receiving a rising edge of the clock signal on line 322. It is to be understood, however, that the polarity of the devices used, as well as the logic, could be changed without departing from the scope of the present invention. For example, logic signals may be transmitted on individual single lines having voltage or current signals with rising and falling edges, or alternatively, multiple lines may be used for positive and negative transitions of a differential signal, as discussed in more detail below. The stored data bit in DFF 320 is transmitted on the DFF Q output to the multiplexer 310 over multiplexer input line 311.

According to one embodiment, the delay cell circuit 340 is configured to receive data Din1 on data input line 331. The output of the delay cell circuit 340 is coupled to the D input of DFF 350. The delay cell circuit 340 is configured to delay the data Din1 by approximately one-half a clock period. The DFF 350 receives delayed data bits Q1 on input line 351 and a clock signal on line 333. DFF 350 is a falling edge triggered flip-flop. Accordingly, DFF 350 stores delayed data Q1 in response to receiving a falling edge of the clock signal on line 333. However, it is to be understood that the polarity of the devices used could be changed without departing from the scope of the present invention. The stored delayed data bit in DFF 350 is transmitted on the DFF Q output to the multiplexer 310 over multiplexer input line 311.

Multiplexer 310 receives a stored data value Q0 on multiplexer input line 311 and a stored delayed data value Q2 on multiplexer input line 312. Multiplexer input lines 311 and 312 are selectively coupled to a single multiplexer serial output line 314, which carries serial data Dout0. The multiplexer 310 is controlled by a signal received on a select input line 313. As previously stated, select input line 313 is coupled to divided clock line 332. Therefore, the multiplexer 310 will couple the stored data bit Q0 on line 311 to the serial output line 314 during a first portion of the clock signal period, and multiplexer 310 will couple the stored delayed data bit Q2 on line 312 to the serial output line 314 during a second portion of the clock signal period.

Figure 4:
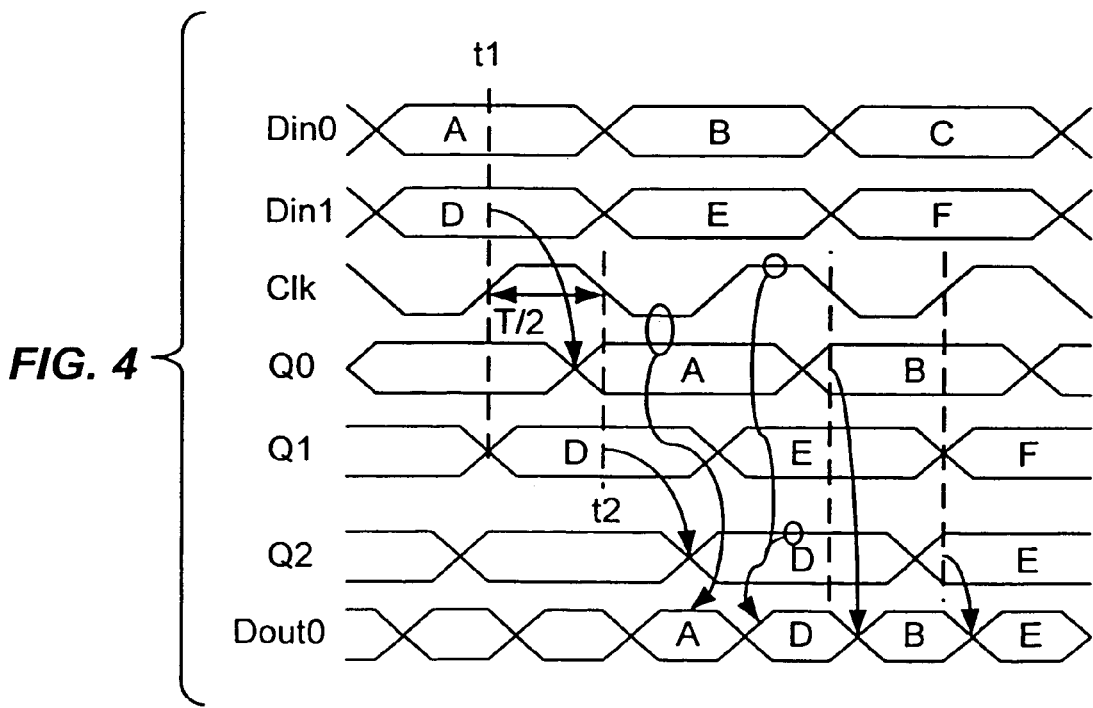
FIG. 4 shows a timing diagram of the data processing circuit of FIG. 3.

FIG. 4 shows a timing diagram of the exemplary data processing circuit of FIG. 3 to aid in understanding the operation of the circuit. The first three timelines show the relation between the received data Din0 and Din1 on input lines 321 and 331, respectively, and the clock signal CLK. Data Din0 on input line 321 is stored into DFF 320 on the rising edge of CLK as shown at timing marker t1. Timing marker t1 is also helpful to illustrate the relation between data Din1 on input line 331 and delayed data Q1 at the output of delay cell circuit 340. According to one exemplary embodiment, the delay cell circuit 340 delays the input data Din1 by approximately one-half the clock signal period. The delayed data Q1 on line 351 is stored in DFF 350 on the falling edge of CLK as shown at timing marker t2. Furthermore, when the clock signal transitions from high to low at t2, then during the low portion of the clock period, the stored data Q0 on multiplexer input line 311 is coupled to the output 314. When the clock signal transitions from low to high, then during the high portion of the clock period, the stored delayed data Q2 on multiplexer input line 312 is coupled to the output 314. Accordingly, data received by the circuit on lines 321 and 331 may be combined on line 314.

FIG. 4 also helps to illustrate a method according to the present invention of serializing data received in parallel. According to FIG. 4, the method includes receiving and storing the first data bit Din0 in a first clocked data storage circuit in response to a first timing signal, such as the rising edge of a clock, for example. A second data bit Din1 may be received and delayed by a delay cell circuit such as the one illustrated at 340 in FIG. 3. The delayed data bit Q1 is then stored in a second clocked data storage circuit in response to a second timing signal, such as the falling edge of the clock, for example. The stored first data bit Q0 may then be coupled to the serial output during a first portion of the clock signal, and the stored delayed second data bit Q2 may be coupled to the serial output during a second portion of the clock signal.

FIG. 5 illustrates a data processing circuit 500 according to another exemplary embodiment of the present invention. The data processing circuit 500 includes a multiplexer 510, a D type flip-flop ("DFF") 520, a first delay cell circuit 540, a second DFF 550, and a second delay cell 560. Data processing circuit 500 is particularly advantageous for implementations where the propagation delay of the DFFs are close to, or greater than, one-half of a clock period. The DFF 520 is coupled to receive a first data bit Din0 on data input line 521. A clock signal CLK is received on clock line 532. The clock line is divided, and clock signals are transmitted to DFF 520 on line 522, DFF 550 on line 533, and second delay cell 560 on line 534. DFF 520 may be a rising edge triggered flip-flop. Accordingly, the DFF 520 stores data Din0 in response to receiving a rising edge of the clock signal on line 522. The stored data bit in DFF 520 is transmitted on the DFF Q output to the multiplexer 510 over multiplexer input line 511.

The first delay cell circuit 540 is configured to receive data Din1 on data input line 531. The output of the delay cell circuit 540 is coupled to the D input of DFF 550. The delay cell circuit 540 is configured to delay the data Din1 by approximately one-half a clock period. The DFF 550 receives delayed data bits Q1 on input line 551 and a clock signal on line 533. DFF 550 may be a falling edge triggered flip-flop. Accordingly, DFF 550 stores delayed data Q1 in response to receiving a falling edge of the clock signal on line 533. The stored delayed data bit in DFF 550 is transmitted on the DFF Q output to the multiplexer 510 over multiplexer input line 512.

Multiplexer 510 receives a stored data value Q0 on multiplexer input line 511 and a stored delayed data value Q2 on multiplexer input line 512. Multiplexer input lines 511 and 512 are selectively coupled to a single multiplexer serial output line 514, which carries serial data Dout0. The multiplexer 510 is controlled by a signal received on a select input line 513. However, due to delays in the DFFs, it may be necessary to delay the reception of the clock signal at the select input line 513 of the multiplexer. Thus, the second delay cell circuit 560 receives the clock signal on delay input line 534 and generates a delayed version of the clock signal on multiplexer select input line 513. Therefore, the multiplexer 510 will couple the stored data bit Q0 on line 511 to the serial output line 514 during a first portion of the delayed clock signal period, and multiplexer 510 will couple the stored delayed data bit Q2 on line 512 to the serial output line 514 during a second portion of the delayed clock signal period. In this manner, the second delay circuit element 560 compensates for delays introduced into the system by the DFFs.

Features and advantages of the present invention have particular significance in applications that required very high frequency operation. For high speed applications, the circuit blocks described above may be implemented using current-controlled complementary metal-oxide-semiconductor field-effect transistor (i.e., C³MOS™) logic, which is described in more detail in commonly owned U.S. application Ser. No. 09/484,856 entitled "CURRENT-CONTROLLED CMOS LOGIC-FAMILY" filed Jan. 18, 2000 by Armond Hairapetian, which is hereby incorporated herein by reference in its entirety.

FIG. 6A illustrates a C³MOS delay circuit 600 that may be used to implement high frequency delay cells according to one embodiment of the present invention. The delay circuit includes a pair of differentially connected MOS transistors 601 and 602. Load resistors 604 and 603 are series connected to inductors 605 and 606. The series connected resistor-inductors are coupled between a power supply line 607 and the drains of MOS transistors 601 and 602. The sources of transistors 601 and 602 are coupled together and through a current source 650 to ground 610. The inductors provide shunt peaking to further improve the bandwidth of the circuit.

Input signals are received at the input of transistors 601 and 602 on differential data lines 620 (i.e., Vinp) and 630 (i.e., Vinn). The outputs of the circuit may be taken at the drains of transistors 601 and 602. Thus, when using a C³MOS logic implementation, it is to be understood that data will be transmitted or received, or both, on a pair of differential data lines. Thus, delay cell 540, receiving Din1, and delay cell 560, receiving CLK, may both receive differential signals when implemented using C³MOS logic. In one embodiment, the delay between the input and output of delay circuit 600 may be less than 1 picosecond. However, the delay of actual implementations may vary with processing. In order to obtain more control over the delay of delay circuit 600, a capacitor array 640 may be used as shown in FIG. 6B. Capacitor array 640 includes first and second capacitors 641 and 642 that are each series connected to switches 643 and 644, respectively. A parallel combination of switched capacitors may be connected between each of the outputs of the delay circuit 600 and ground 610. Thus, the delay time between the input and output of the delay circuit 600 can be varied by selectively activating/deactivating (i.e., ON/OFF) the switches 643 and 644, thereby selectively coupling capacitors 641 and 642 to an output of the delay circuit 600. When one or both of the switches 643 and 644 are switched ON, the capacitance on the output node will increase, and a longer delay will result. Switching the capacitors out of the circuit will correspondingly reduce the delay.

Figure 7:
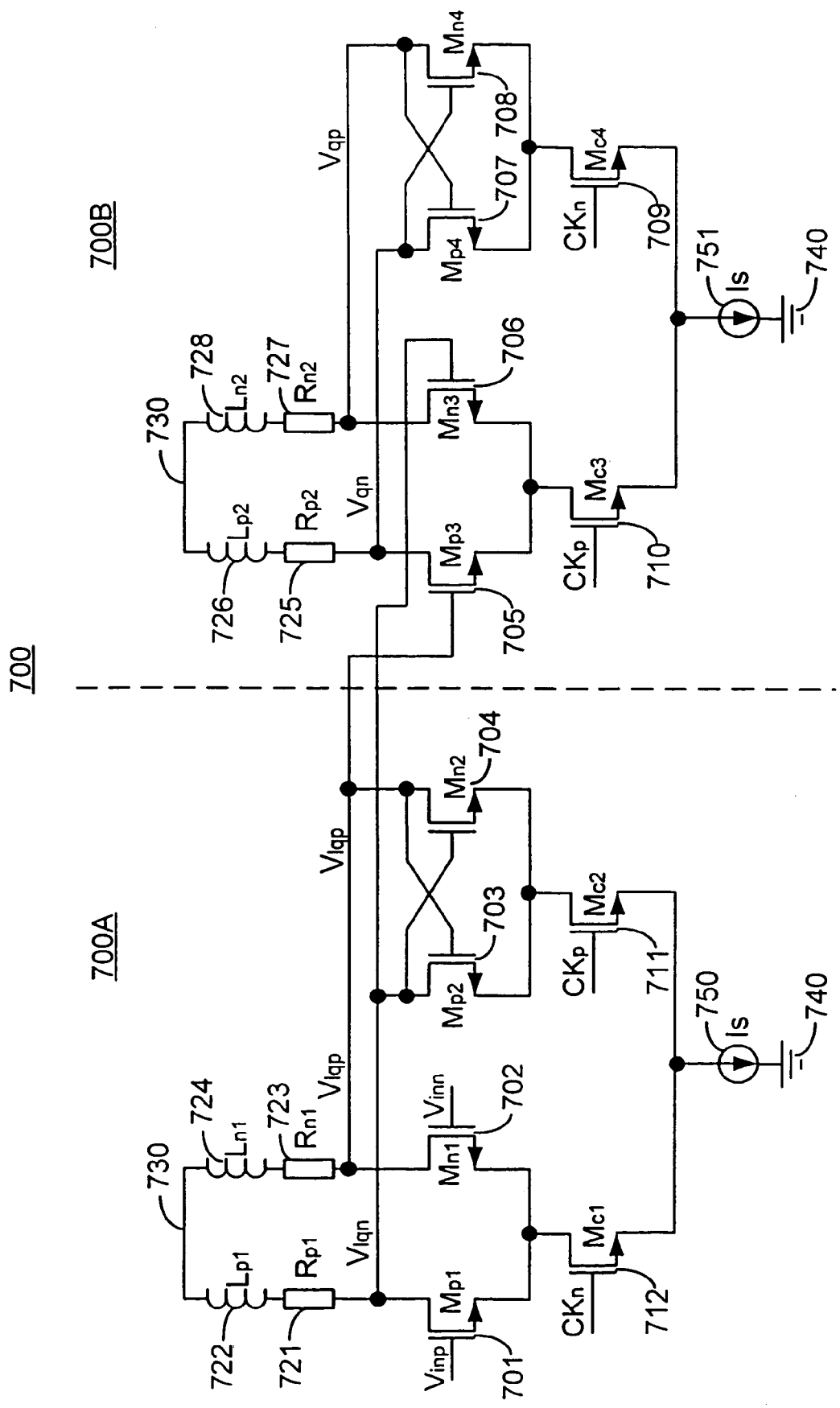
FIG. 7 illustrates a D type flip-flop according to one embodiment of the present invention.

FIG. 7 illustrates a C³MOS clocked D type flip-flop 700 according to one embodiment of the present invention. DFF 700 includes series connected latches 700A and 700B that each include a differential pair of transistors 701-702 and 705-706. Latch 700A includes a first differential pair 701-702 that receives differential inputs Vinp and Vinn at the gate terminals, and a second differential pair of transistors 703-704 that have their gate and drain terminals cross-coupled to the outputs of the first differential pair 701-702. Clocked transistors 712 and 7.11 respectively connect common-source nodes of differential pairs 701-702 and 703-704 to a current-source 750. Complementary clock signals CKn and CKp drive the gate terminals of clocked transistors 712 and 711. The first differential pair 701-702 of latch 700A also includes load resistors 721 and 723 that are each connected in series with inductors 722 and 724 between a voltage supply 730 and the drains of transistors 701 and 702, respectively.

A C³MOS master-slave flip-flop 700 can be made by combining the two latches 700A and 700B as shown in FIG. 7. A first latch 700A receives differential input signals Vinp and Vinn and generates differential output signals Vlqn and Vlqp. The differential output signals Vlqn and Vlqp are then applied to the differential inputs of transistors 705 and 706 of a second latch 700B. The differential pair 705-706 of latch 700B also includes load resistors 725 and 727 that are each connected in series with inductors 726 and 728 between a voltage supply 730 and the drains of transistors 705 and 706, respectively. The second latch 700B also includes a differential pair of transistors 707-708 having cross coupled gate and drain terminals, clocked transistors 710 and 709, and current-source 750. The differential outputs Vqn and Vqp of second latch 700B provide the outputs of flip-flop 700.

Figure 8:
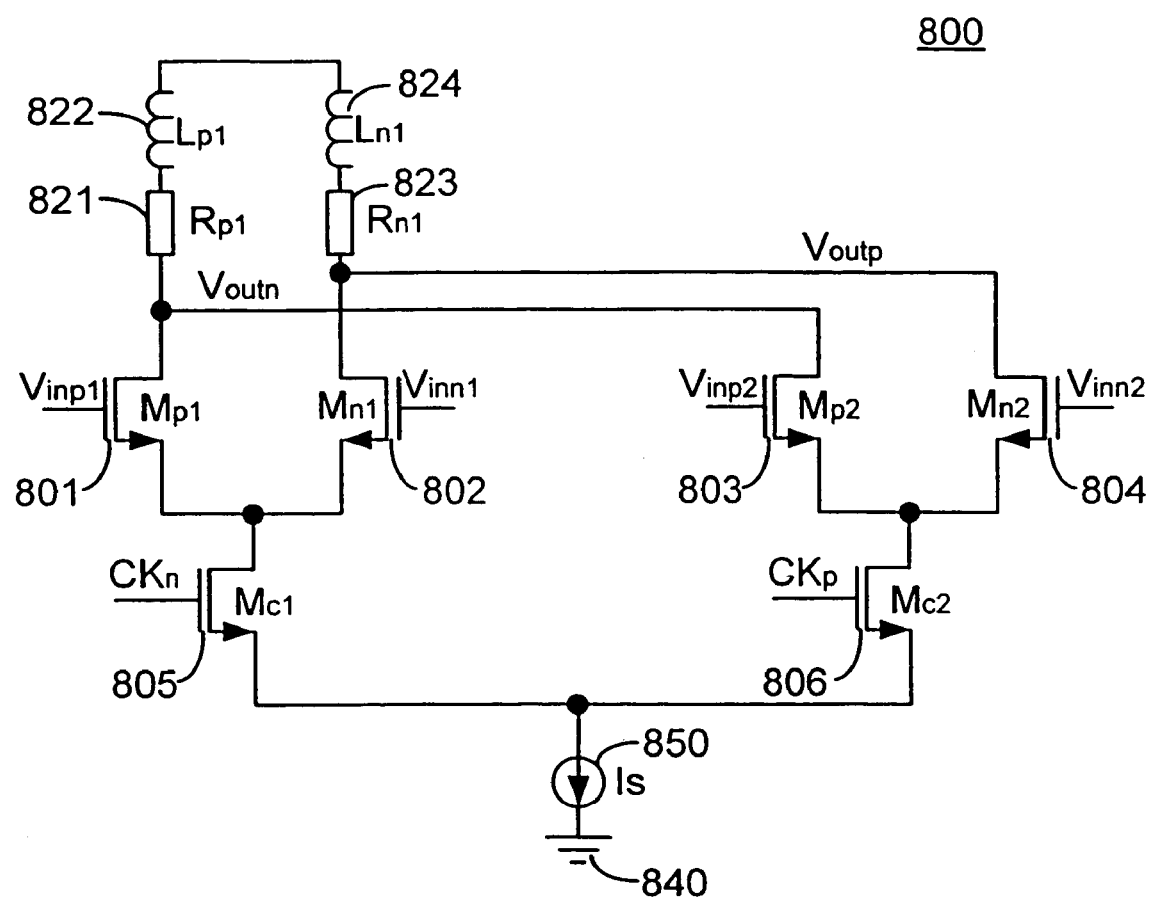
FIG. 8 illustrates a multiplexer according to one embodiment of the present invention.

FIG. 8 illustrates an exemplary C³MOS implementation for a 2:1 multiplexer according to one embodiment of the present invention. Multiplexer 800 includes a differential pair of transistors 801-802 and 803-804 for each input, but multiplexer 800 further includes select transistors 805 and 806 inserted between the common source terminals of the differential pairs and the current source 850. By asserting one of the select input signals, such as, for example, differential clock signals CKn or CKp, the bias current is steered to the differential pair associated with that select transistor. Thus, signal CKn steers the bias current to the differential pair with Vinp1 and Vinn1 inputs, and signal CKp steers the bias current to the differential pair with Vinp2 and Vinn2 inputs.

Figure 9:
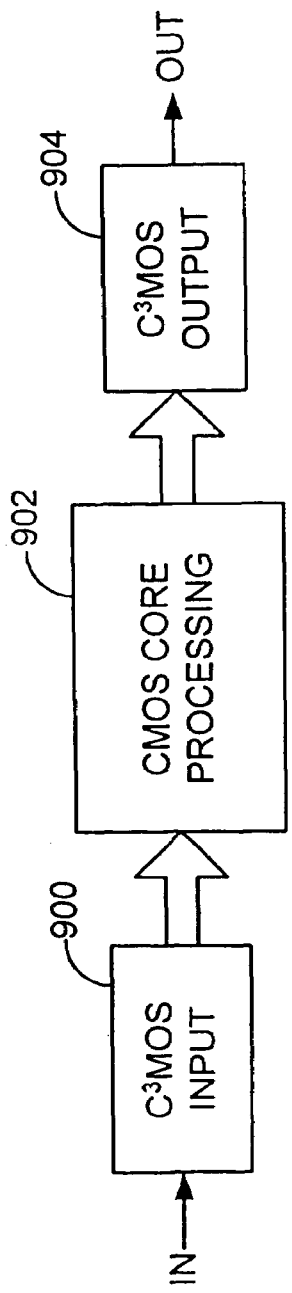
FIG. 9 shows a block diagram for a circuit that combines $C^3MOS$ and conventional CMOS logic on a single silicon substrate to achieve optimum tradeoff between speed and power consumption.

In one embodiment, the present invention may be utilized in a system processing data in the gigahertz range (i.e. above 1 GHz). For instance, one application the present invention may be used in a system that combines C³MOS logic with conventional CMOS logic to achieve an optimum balance between speed and power consumption. According to this embodiment, an integrated circuit utilizes C³MOS logic for the ultra high speed (e.g., GHz) portions of the circuitry, and conventional CMOS logic for the relatively lower speed sections. For example, to enable an integrated circuit to be used in ultra high speed applications, the input and output circuitry that interfaces with and processes the high speed signals is implemented using C³MOS. The circuit also employs C³MOS to divide down the frequency of the signals being processed to a low enough frequency where conventional CMOS logic can be used. The core of the circuit, according to this embodiment, is therefore implemented by conventional CMOS logic that consumes zero static current. FIG. 9 shows a simplified block diagram illustrating this exemplary embodiment of the invention. A C³MOS input circuit 900 receives a high frequency input signal IN and outputs a divided down version of the signal IN/n. The lower frequency signal IN/n is then processes by core circuitry 902 that is implemented in conventional CMOS logic. A synchronous data serialization circuit according to the present invention may then be used in C³MOS output circuit 904 to convert the processed IN/n signal back to the original frequency (or any other desired frequency) before driving it onto the output node OUT.

Figure 10:
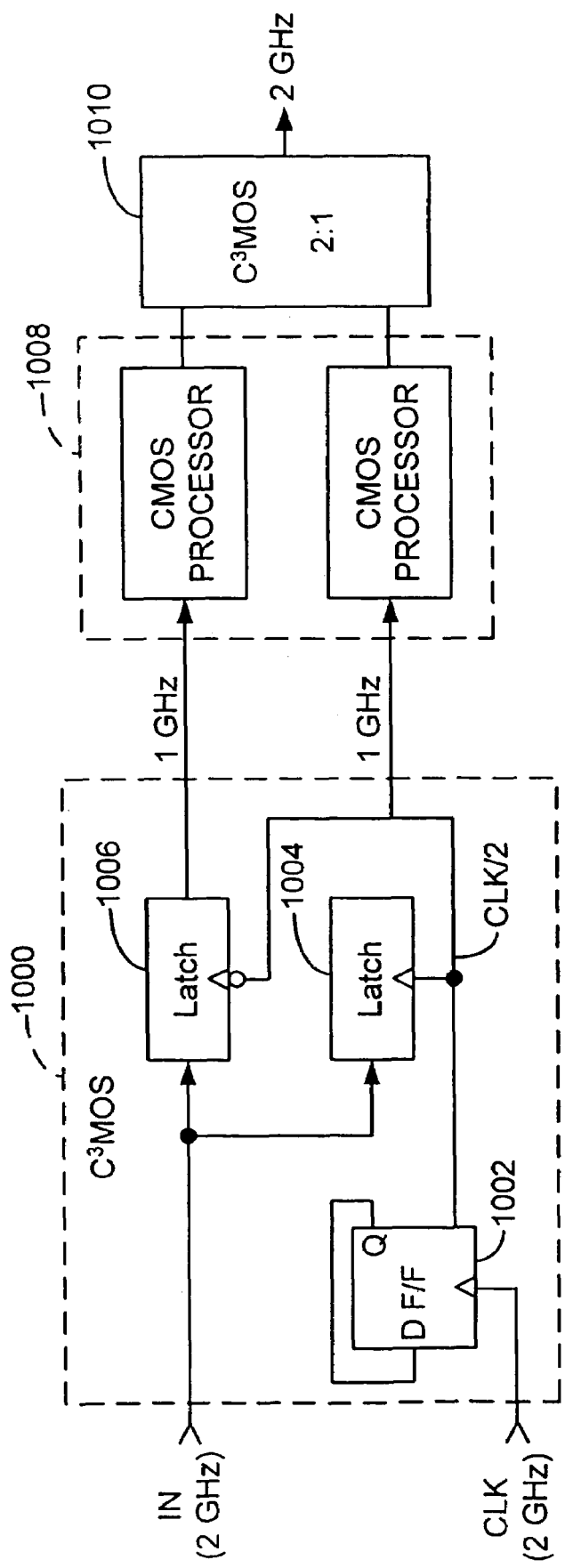
FIG. 10 shows an exemplary circuit application of the $C^3MOS$/CMOS combined logic wherein $C^3MOS$ logic is used to deserialize and serialize the signal stream while CMOS logic is used as the core signal processing logic circuitry.

FIG. 10 shows an exemplary circuit application of the C³MOS/CMOS combined logic wherein C³MOS logic is used to deserialize and serialize the signal stream while CMOS logic is used as the core signal processing logic circuitry. C³MOS input circuitry 1000 is a deserializer that receives a serial bit stream at a high frequency of, for example, 2 GHz. A 2 GHz input clock signal CLK is divided down to 1 GHz using a C³MOS flip-flop 1002, such as the one shown in FIG. 7, that is connected in a ÷2 feedback configuration. The 1 GHz output of flip-flop 1002 is then supplied to clock inputs of a pair of C³MOS latches 1004 and 1006. Latches 1004 and 1006 receive the 2 GHz input bit stream at their inputs and respectively sample the rising and falling edges of the input bit stream in response to the 1 GHz clock signal CLK/2. The signal CLK/2 which is applied to the inputs of each latch, samples the input data preferably at its center. It is to be noted that the rise and fall times of the signal in CMOS logic is often very dependent on process variations and device matching. C³MOS logic, on the other hand, is differential in nature and therefore provides much improved margins for sampling.

Referring again to FIG. 10, block 1000 thus deserializes the input bit stream with its frequency halved to allow for the use of conventional CMOS logic to process the signals. The signals at the outputs of latches 1004 and 1006 are applied to parallel processing circuitry 1008 that are implemented in conventional CMOS logic operating at 1 GHz. The reverse is performed at the output. Thus, a serializer 1010 according to the present invention may receive the output signals from processing circuitry 1008 and serializes them using C³MOS logic. The final output signal is a bit stream with the original 2 GHz frequency. Circuit applications wherein this technique can advantageously be employed include high speed single or multi-channel serial links in communication systems.

As apparent from the circuit shown in FIG. 10, this technique doubles the amount of the core signal processing circuitry. However, since this part of the circuit is implemented in conventional CMOS logic, current dissipation is not increased by the doubling of the circuitry. Those skilled in the art appreciate that there can be more than one level of deserializing and serializing if further reduction in operating frequency is desired. That is, the frequency of the input signal can be divided down further by 4 or 8 or more if desired, and then later recombined using the serializer techniques of the present invention. As each resulting bit stream will require its own signal processing circuitry, the amount and size of the overall circuitry increases in direct proportion to the number by which the input signal frequency is divided. For each application, therefore, there is an optimum number depending on the speed, power and area requirements.

Figure 11:
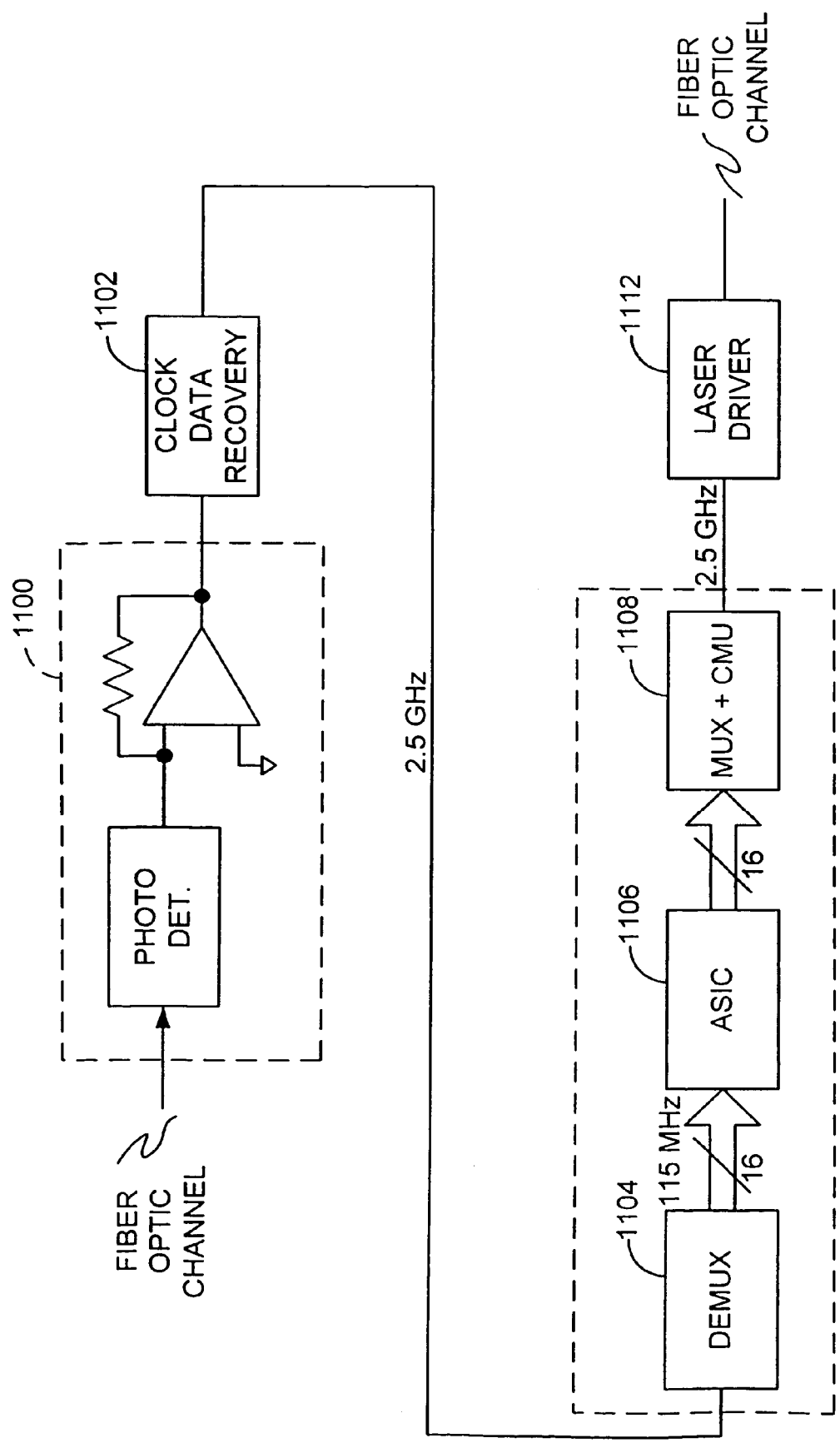
FIG. 11 is a simplified block diagram of a tranceiver system that utilizes the C³MOS/CMOS combined logic according to the present invention to facilitate interconnecting high speed fiber optic communication channels.

FIG. 11 is a simplified block diagram of a tranceiver system that utilizes C³MOS/CMOS combined logic to facilitate interconnecting high speed fiber optic communication channels. The exemplary tranceiver of FIG. 11 is typically found along fiber optic channels in high speed telecommunication networks. The tranceiver includes at its input an optical input system 1100 such as, for example, a photo detect and driver circuit that receives the input signal from the fiber optic channel. Circuit 1100 converts fiber-optic signal to packets of data and supplies it to a clock data recovery (CDR) circuit 1102. CDR circuit 1102 recovers the clock and data signals that may be in the frequency range of about 2.5 GHz. Established telecommunication standards require the tranceiver to perform various functions, including data monitoring and error correction. These functions are performed at a lower frequency. Thus, the tranceiver uses a demultiplexer 1104 which deserializes the 2.5 GHz data stream into, for example, 16 parallel signals having a frequency of about 115 MHz. An application specific integrated circuit (ASIC) 1106 then performs the monitoring and error correction functions at the lower (115 MHz) frequency. The present invention may then be utilized to implement a multiplexer and clock multiplication unit (CMU) 1108 to convert the parallel signals back into a single bit stream at 2.5 GHz. This signal is then coupled to an optical output system 1112 that retransmits the data back onto the fiber optic channel by a laser driver, for example. The combined C³MOS/CMOS techniques allow demultiplexer 1104, ASIC 1106 and a multiplexer and CMU 1108, which utilizes the present invention, to be fabricated on a single silicon die.

Having fully described several embodiments of the present invention, other equivalent or alternative methods of practicing the present invention will be apparent to those skilled in the art. For example, the polarity of the signals used to control the storing of data bits received and selection of the multiplexer may be modified. Additionally, alternate configurations of the delay cell circuit for delaying the storing of the data in the storage circuit in the second signal path could be used. Furthermore, other clocked data storage circuits structures could be used such as latches, other FF structures, or other forms of regenerative memories. These and other embodiments as well as alternatives and equivalents to the invention will be recognizable to those of skill in the art after reading the description of the present invention. The scope of the invention should not, therefore, be determined solely by reference to the above description, but instead should be determined with reference to the appended claims along with their full scope of equivalents and alternatives.

What is claimed is:

1. A transceiver for use between interconnected high speed fiber optic communication channels, the transceiver comprising:
   an optical input system having a photo detect and driver circuit which is configured to receive an input signal from an input fiber optic channel and is configured to convert the input signal to packets of data;
   a clock data recovery circuit coupled to the optical input system which is configured to receive packets of data from the optical input system and is configured to recover clock and data signals having a first frequency from the packets of data;
   a demultiplexer coupled to the clock data recovery circuit which is configured to deserialize clock and data signals received from the clock data recovery circuit into a plurality of parallel signals having a second frequency lower than the first frequency;
   an application specific integrated circuit coupled to the demultiplexer which is configured to perform at least one of monitoring and error correction functions at the second frequency on the plurality of parallel signals received from the demultiplexer;
   a multiplexer and clock multiplication unit coupled to the application specific integrated circuit which is configured to convert the plurality of parallel signals received from the application specific integrated circuit into a signal bit stream at the first frequency, wherein the multiplexer is configured to operate to establish a phase relationship between each of the plurality of parallel signals received from the application specific integrated circuit and convert the parallel signals to a serial bit stream at the first frequency based upon the established phase relationship; and
   an optical output system coupled to the multiplexer and clock multiplication unit which is configured to retransmit the single bit stream received from the multiplexer and clock multiplication unit onto an output fiber optic channel.

2. The transceiver of claim 1, wherein a laser driver is configured to retransmit the single bit stream received from the multiplexer and clock multiplication unit onto the output fiber optical channel.

3. The transceiver of claim 1, wherein the demultiplexer is configured to deserialize clock and data signals received from the clock data recovery circuit into sixteen parallel signals having a second frequency.

4. The transceiver of claim 1, wherein the optical input system, clock data recovery circuit, demultiplexer, application specific integrated circuit, multiplexer and clock multiplication unit, and optical output system are fabricated on a single silicon die.

5. The transceiver of claim 1, wherein the transceiver is implemented using current-controlled complementary metal-oxide semiconductor ($C^3MOS$) logic.

6. The transceiver of claim 1, wherein the clock data recovery circuit comprises one or more D type flip-flops.

7. the transceiver of claim 6, wherein the clock data recovery circuit is configured to recover a data signal from the packets of data using a rising edge triggered D type flip-flop.

8. The transceiver of claim 6, wherein the clock data recovery circuit recovers a clock signal from the packets of data using a falling edge triggered D type flip-flop.

9. The transceiver of claim 8, further comprising a data signal circuit coupled to an input of the falling edge triggered D type flip-flop for delaying application of a signal to the falling edge triggered D type flip-flop.

10. The transceiver of claim 6, further comprising a clock delay circuit coupled to the multiplexer for delaying application of a clock signal to the multiplexer to compensate for delays introduced by the clock data recovery circuit.

11. The transceiver according to claim 1, wherein the multiplexer is operably connected to:
    a plurality of data storage circuits, each of the data storage circuits configured to receive a respective parallel signal of the plurality of parallel signals and configured to store a data bi corresponding to the respective parallel signal at a time that is determined based on a received timing signal; and
    a delay circuit, the delay circuit configured to cause a delay in the storage of a data bit in at least one of the data storage circuits.

12. A delay circuit comprising:
    a first differentially connected MOS transistor;
    a second differentially connected MOS transistor;
    a first load resistor serially connected to a first inductor to form a first resistor-inductor pair;
    a second load resistor serially connected to a second inductor to form a second resistor-inductor pair,
    wherein the first resistor-inductor pair is coupled between a power supply line and the drain of the first differentially connected MOS transistor and the second resistor-inductor pair is coupled between a power supply line and the drain of the second differentially connected MOS transistor,
    wherein the source of the first differentially connected MOS transistor and the second differentially connected MOS transistor are coupled together through a current source to a ground,
    wherein a first input signal is received at a first input of the first differentially connected MOS transistor on a first differential data line, and a second input signal is received at a second input of the second differentially connected MOS transistor on a second differential data line,
    wherein a first output is provided at a drain of the first differentially connected MOS transistor, and a second output is provided at a drain of the second differentially connected MOS transistor, and
    wherein data may be either transmitted or received on the first differential data line and the second differential data line,
    further comprising a first parallel combination of switched capacitors connected between the first output and ground, and a second parallel combination of switched capacitors connected between the second output and ground.

13. A delay circuit comprising:
a first differentially connected MOS transistor;
a second differentially connected MOS transistor;
a first load resistor serially connected to a first inductor to form a first resistor-inductor pair;
a second load resistor serially connected to a second inductor to form a second resistor-inductor pair,
wherein the first resistor-inductor pair is coupled between a power supply line and the drain of the first differentially connected MOS transistor and the second resistor-inductor pair is coupled between a power supply line and the drain of the second differentially connected MOS transistor,
wherein the source of the first differentially connected MOS transistor and the second differentially connected MOS transistor are coupled together through a current source to a ground,
wherein a first input signal is received at a first input of the first differentially connected MOS transistor on a first differential data line, and a second input signal is received at a second input of the second differentially connected MOS transistor on a second differential data line,
wherein a first output is provided at a drain of the first differentially connected MOS transistor, and a second output is provided at a drain of the second differentially connected MOS transistor, and
wherein data may be either transmitted or received on the first differential data line and the second differential data line,
further comprising a first parallel combination of switched capacitors connected between the first output and ground, and a second parallel combination of switched capacitors connected between the second output and ground, wherein the first parallel combination and second parallel combination of switched capacitors are selectively activated to vary delay times of the delay circuit.

14. A method of processing a signal between interconnected high speed fiber optic communication channels, the method comprising:
receiving an input signal from a fiber optic input channel and converting the input signal to packets of data;
recovering clock and data signals having a first frequency from the packets of data;
deserializing the clock and data signals into a plurality of parallel signals having a second frequency lower than the first frequency;
performing monitoring and error correction functions at the second frequency on the plurality of parallel signals;
establishing a phase relationship between each of the plurality of parallel signals;
multiplexing the plurality of parallel signals into a serial bit stream at the first frequency based upon the established phase relationship, and
retransmitting the serial bit stream received from the multiplexer and clock multiplication unit onto a fiber optic output channel.

15. The method of claim 14, wherein the clock and data signals are recovered from the packets of data using D type flip-flops.

16. The method of claim 14, wherein the data signal is recovered from the packets of data using a rising edge triggered D type flip-flop.

17. The method of claim 14, wherein the clock signal is recovered from the packets of data using a falling edge triggered D type flip-flop.

18. The method of claim 17, further comprising delaying application of a signal to the falling edge triggered D type flip-flop.

19. The method of claim 14, further comprising delaying deserializing the clock and data signals to compensate for delays caused by recovery of the clock and data signals.

20. The method according to claim 14, wherein the establishing the phase relationship further comprises:
storing a data bit corresponding to each of the respective parallel signals in a corresponding data storage circuit; and
delaying the storage of at least one of the stored data bits in its corresponding data storage circuit.

* * * * *

UNITED STATES PATENT AND TRADEMARK OFFICE
CERTIFICATE OF CORRECTION

| | | |
|---|---|---|
| PATENT NO. | : 7,298,301 B2 | Page 1 of 1 |
| APPLICATION NO. | : 10/919093 | |
| DATED | : November 20, 2007 | |
| INVENTOR(S) | : Bo Zhang | |

It is certified that error appears in the above-identified patent and that said Letters Patent is hereby corrected as shown below:

Column 10,
      Line 6, please replace "the transceiver" with --The transceiver--
      Line 26, please replace 'bi" with --bit--

Signed and Sealed this

Third Day of March, 2009

JOHN DOLL
*Acting Director of the United States Patent and Trademark Office*